United States Patent
Chan et al.

(10) Patent No.: US 12,446,247 B2
(45) Date of Patent: Oct. 14, 2025

(54) CIRCUIT CELL FOR A STANDARD CELL SEMICONDUCTOR DEVICE

(71) Applicant: IMEC VZW, Leuven (BE)

(72) Inventors: Boon Teik Chan, Wilsele (BE); Bilal Chehab, Leuven (BE); Julien Ryckaert, Schaerbeek (BE)

(73) Assignee: Imec VZW, Leuven (BE)

( * ) Notice: Subject to any disclaimer, the term of this patent is extended or adjusted under 35 U.S.C. 154(b) by 455 days.

(21) Appl. No.: 18/298,820

(22) Filed: Apr. 11, 2023

(65) Prior Publication Data

US 2023/0361205 A1 Nov. 9, 2023

(30) Foreign Application Priority Data

May 5, 2022 (EP) .................................. 22171942

(51) Int. Cl.
*H10D 30/43* (2025.01)
*H01L 23/528* (2006.01)
*H10D 30/67* (2025.01)
*H10D 62/10* (2025.01)
*H10D 84/82* (2025.01)

(52) U.S. Cl.
CPC ......... *H10D 30/43* (2025.01); *H01L 23/5286* (2013.01); *H10D 30/6735* (2025.01); *H10D 62/121* (2025.01); *H10D 84/82* (2025.01)

(58) Field of Classification Search
CPC .. H10D 30/6735; H10D 30/43; H10D 62/121; H10D 84/82; H01L 23/5286
See application file for complete search history.

(56) References Cited

U.S. PATENT DOCUMENTS

2018/0204762 A1* 7/2018 Min .................. H01L 21/76229
2024/0222372 A1* 7/2024 Olson ................ H10D 30/6735

FOREIGN PATENT DOCUMENTS

CN 111755333 A 10/2020
EP 4019462 A1 6/2022

OTHER PUBLICATIONS

Extended European Search Report and Written Opinion, Application No. EP 22171942.0, mailed Nov. 3, 2022, 7 pages.
Weckx, Pieter, Julien Ryckaert, E. Dentoni Litta, Dmitry Yakimets, Philippe Matagne, Pieter Schuddinck, Doyoung Jang et al. "Novel forksheet device architecture as ultimate logic scaling device towards 2nm." In 2019 IEEE International Electron Devices Meeting (IEDM), pp. 36-5. IEEE, 2019.

* cited by examiner

*Primary Examiner* — Changhyun Yi
(74) *Attorney, Agent, or Firm* — McDonnell Boehnen Hulbert & Berghoff LLP (57) ABSTRACT

A standard cell semiconductor device is provided that includes a first and second FET device, each including: (i) a source body and a drain body, each including a common source or drain body portion and a set of source or drain prongs protruding from the common source or drain body portion, (ii) a set of channel layers, each channel layer extending between a pair of source and drain prongs, and (iii) a gate body including a common gate body portion and a set of gate prongs protruding from the common gate body portion.

20 Claims, 6 Drawing Sheets

CIRCUIT CELL FOR A STANDARD CELL SEMICONDUCTOR DEVICE

CROSS-REFERENCE TO RELATED APPLICATIONS

The present application is a non-provisional patent application claiming priority to European Patent Application No. EP 22171942.0, filed on May 5, 2022, the contents of which are hereby incorporated by reference.

FIELD OF THE DISCLOSURE

The present disclosure relates to a circuit cell for a standard cell semiconductor device, and to a standard cell semiconductor device.

BACKGROUND

Modern semiconductor device processing involves designing integrated circuits comprising a great number of standardized circuit cells ("standard cells") comprising a combination of active devices, such as n-type and p-type field effect transistors (nFET and pFET). Intra- and inter-cell signal routing between active devices may be provided by an interconnect structure comprising, e.g., a set of metal lines and vias. Standard cells may be designed to provide certain functionality, logic functions, storage functions or the like. In standard cell methodology, the designer may accordingly combine cells from a library of standard cells to design a circuit with desired functions.

Advances in processing techniques has allowed a continued scaling of important device parameters such as line pitch, transistor gate length and contacted poly pitch (CPP), thus enabling standard cells with reduced track height and improved area efficiency.

A reduced track height may however result in a reduced pn separation between adjacent transistors of a circuit cell. A reduced pn separation may among other things complicate gate formation, for instance reducing the margin for selective removal of the p-type work function metal (pWFM) from the nFET. One approach for increasing the pn separation without increasing the track height would be to reduce the channel width. In a nanosheet-based FET (NSHFET) a reduced channel width may be obtained by reducing a width of the channel nanosheets. This may however result in a reduced performance, e.g. a reduced drive current.

SUMMARY

The present disclosure provides a circuit cell for a standard cell semiconductor device that has a design that facilitates the reduction of track height while mitigating the challenges associated with reduced PN separation.

According to a first aspect there is provided a circuit cell for a standard cell semiconductor device. The circuit cell includes a first field effect transistor (FET) device. The first FET device includes a first source body and a first drain body, each including a first common source or drain body portion arranged along a first routing track of the circuit cell, and a first set of source or drain prongs protruding from the first common source or drain body portion to define an overlap with a second routing track of the circuit cell that is parallel to the first routing track. The first FET device further includes a first set of channel layers, each channel layer extending along the second routing track between a pair of source and drain prongs. The first FET device further includes a first gate body comprising a first common gate body portion arranged along a third routing track of the circuit cell that is parallel to the second routing track, the second routing track being intermediate between the first and third routing tracks, and the first gate body further comprising a set of gate prongs protruding from the first common gate body portion to define an overlap with the second routing track and the channel layers.

The circuit cell further comprises a second FET device. The second FET device comprises a second source body and a second drain body, each comprising a second common source or drain body portion arranged along the third routing track, and a second set of source or drain prongs protruding from the second common source or drain body portion to define an overlap with the second routing track. The second FET device further comprises a second set of channel layers, each channel layer extending along the second routing track between a pair of source and drain prongs. The second FET device further comprises a second gate body comprising a common gate body portion arranged along the first routing track, and a set of gate prongs protruding from the second common gate body portion to define an overlap with the second routing track and the channel layers.

The circuit cell described herein is based on two FET devices of a corresponding design in which the common gate body portion and the common source/drain body portions of the respective FET devices may be arranged at opposite sides of the second routing track. The first and second common body portions of the respective first and second FET devices may thus be offset laterally with respect to the first and second common source/drain body portions. Meanwhile, the gate prongs of the respective FET device may be offset vertically with respect to its source and drain prongs. This offset/non-overlapping gate-to-source/drain design allows use of thinner gate spacers or even the omission of gate spacers altogether, such gate spacer otherwise appearing twice in the CPP of a conventional FET device.

Since the first set of channel layers of the first FET device and the second set of channel layers of the second FET device are arranged along the second routing track (and hence are aligned with each other as seen along a channel direction of FET devices), the PN separation along a height direction of the cell (which is present in conventional designs) is eliminated. Additionally, the respective gate bodies of the two FET devices (i.e. the first and second gate bodies) may be decoupled from each other in the sense that they may be provided along separate gate tracks. This may facilitate gate formation, e.g. by allowing independent and separate deposition of different gate WFMs at the first and second FET devices.

The first common gate body portion of the first FET device and the second common gate body portion of the second FET device are arranged along different routing tracks (the third and first, respectively). Correspondingly, the first common source/drain body portion of the first FET device and the second common source/drain body portion of the second FET device are arranged along different routing tracks (the first and third, respectively). This allows the first and second FET devices to be arranged with a reduced spacing as viewed along a length direction of the cell.

The first and second FET devices may respectively be an n-type FET and a p-type FET, or vice versa. The circuit cell may hence be used to realize a Complementary Metal Oxide Semiconductor (CMOS) circuit cell. It is however envisaged that the circuit cell may be used also in a circuit cell comprising a first and second FET device of a same conductivity type.

As used herein, the term "standard cell semiconductor device" refers to a semiconductor device comprising a plurality of circuit cells, each cell configured to provide a certain functionality. Example types of cells include logic cells and memory cells, such as those typically found in standard cell libraries, comprising for instance NAND, NOR, D-flip flop, multiplexers etc.

The circuit cell may be a unit cell, i.e. defining a minimum functional unit (e.g. a logic function). A standard cell semiconductor device may comprise a plurality of such unit cells, possibly in combination with other unit cells with other functions, interconnected to provide a desired functionality.

As used herein, the term "lateral" indicates an orientation or a direction parallel to a plane of extension of the circuit cell. The circuit cell (and the standard cell semiconductor device) may comprise a substrate wherein "lateral" may be understood as parallel to the substrate. The term "horizontal" may be used as a synonym to "lateral".

As used herein, the term "vertical" indicates an orientation or a direction transverse to the lateral/horizontal orientation or direction, i.e. transverse or normal to the plane of extension of the circuit cell (or the substrate).

As used herein, the term "prong" in connection with source/drain/gate refers to a portion (e.g. layer-shaped) of the source/drain/gate body protruding laterally from the common source/drain/gate body portion to a respective free end.

As used herein, the terms "track height" or "cell height" refers to a dimension of the cell as seen along a direction transverse to the routing tracks. E.g. a track or cell height of three (3) tracks indicates (in units of number of tracks) that an extension of the cell as seen along a direction transverse to the routing tracks is three (3). Correspondingly, the term "cell length" may be used to denote a dimension along the direction of the routing tracks (which is parallel to a channel direction of the channel layers/FET devices).

As used herein, the term "routing track" (or shorter "track") is used in the normal sense of the word to denote a horizontally extending geometrical track or lane defining a position or place holder for a routing resource in the form of a conductive line in relation to the cell. A plurality of routing tracks are typically defined to extend in parallel to each other and may have a uniform spacing and pitch. During a design phase of a standard cell semiconductor device, the presence of a routing track indicates a position available for a routing resource. In an actual circuit cell a conductive line (e.g. of metal) may be provided along the routing track if the routing resource provided by the routing track is to be used, or a dummy line (e.g. of an insulating material) may be provided along the routing track if the routing resource if the routing track is not be used. Generally, unless stated otherwise, a feature (e.g. a line) extending along a given track may be understood as the feature extending along and coinciding with the track, i.e. the feature being accommodated within the routing track.

In some embodiments, the circuit cell may further comprise a first insulating wall separating the first common source body portion and first common drain body portion of the first FET device, and a second insulating wall separating the second common source body portion and the second common drain body portion of the second FET device. The first/second common source and drain body portions may hence be physically and electrically separated from each other. The first and second insulating walls may be aligned with the first and second gates, respectively.

In some embodiments, the circuit cell may further comprise a third insulating wall arranged along the second routing track and separating the set of channel layers of the first FET device from the set of channel layers of the second FET device.

The first and second sets of channel layers may be physically and electrically separated from each other along the second routing track. This may be beneficial in examples where the first and second FETs have complementary conductivity types. The third insulating wall may facilitate confinement of P- and N-type epitaxy to the respective FET devices.

The third insulating wall may further separate the first common drain body portion of the first FET device from the second common source body portion of the second FET device. The first common drain body portion and the second common source body portions may hence be physically and electrically separated from each other along the second routing track. A source-to-drain connection may be provided using a separate source-drain interconnect structure.

In some embodiments, the first and second FET devices may each further comprise: a set of source-side insulating spacer layers (e.g. a first set of source-side insulating spacer layers of the first FET device and a second set of source-side insulating spacer layers of the second FET device) arranged between the (first or second) source prongs of the respective FET device and a set of drain-side insulating spacer layers (e.g. a first set of drain-side insulating spacer layers of the first FET device and a second set of drain-side insulating spacer layers of the second FET device) arranged in spaces between the (first or second) drain prongs of the respective FET device (first or second FET device), wherein each (first or second) gate prong of the respective FET device is arranged intermediate a respective pair of (first or second) source-side and drain-side insulating spacer layers. Each gate prong may hence be surrounded by a pair of insulating spacer layers as viewed along the channel direction.

In some embodiments, each pair of source and drain prongs of the respective FET device may be arranged level with a respective channel layer. The first and second FET devices device may thus comprise an alternating arrangement of first and second device levels, a gate prong is arranged in each first device level, and wherein a pair of source and drain layer prongs and a channel layer is arranged in each second device level.

In some embodiments, the circuit cell may be a three-track height cell, the second routing track being a center track and the first and third routing tracks being edge tracks. The circuit cell may thus be formed as a low track height cell with the related advantages discussed above, such as a relaxed requirement on PN spacing along the cell height direction.

The center track of the cell denotes a track at a central position/mid-position with respect to the cell, as viewed along the cell direction. The edge tracks off-center may be located on mutually opposite sides of the center track, with a same spacing from the center track. The edge tracks may define the outermost tracks of the cell, i.e. the tracks of the cell closest to the cell boundary.

In some embodiments, the circuit cell may comprise a first buried power rail arranged along the first routing track, and a second buried power rail arranged along the third routing track. The circuit cell may hence be provided with supply voltages without allocating the routing tracks of the cell or other routing resources in a back-end-of-line interconnect structure. The buried power rails may be embedded (e.g. arranged in respective trenches) in a substrate of the circuit cell.

In some embodiments, the circuit cell may further comprise a source-drain interconnect structure comprising a conductive line coupled to the common drain body portion of the first FET device and the common source body portion of the second FET device. A low-resistance source-to-drain connection may hence be provided between the first and second FET devices. The source-drain interconnect structure may be combined with the above-mentioned embodiments comprising the third insulating wall, wherein the interconnect structure may interconnect the drain and source of the FET devices over the third insulating wall.

The source-drain interconnect structure may further comprise a first via coupled to the common drain body portion of the first FET device and a second via coupled to the common source body portion of the second FET device, wherein the conductive line may be coupled to the common drain body portion through the first via and to the common source body portion through the second via.

The first and second sets of channel layers may each be formed of a Si-comprising material. The channel layers may for example be formed as Si-layers or SiGe layers.

In some embodiments, the first and second common source body portions and the first and second common drain body portions may each comprise semiconductor material.

The common source and drain body portions may each be or comprise epitaxial/epitaxially grown semiconductor portions. The common source and drain body portions may merge the source/drain prongs of the respective body.

The common source and drain body portions may also or alternatively each comprise metal. The common source and drain body portions may each be or comprise a metal body portion. In a combined semiconductor-metal embodiment, each common source and drain body portion may comprise a semiconductor (sub-)portion merging the source/drain prongs of the respective body and a metal (sub-)portion on the semiconductor (sub-)portion. The metal (sub-)portion may form a wrap-around contact with respect to the (sub-) semiconductor portion.

According to a second aspect, there is provided a standard cell semiconductor device comprising first and second neighboring circuit cells, each according to the first aspect or any of the embodiments or variations thereof, wherein the gate body of the first FET device of the first circuit cell and the gate body of the first FET device of the second circuit cell are arranged along a first gate track transverse to the routing tracks, wherein the gate body of the second FET device of the first circuit cell and the gate body of the second FET device of the second circuit cell are arranged along a second gate track parallel to the first gate track, and the wherein the first routing track of the second circuit cell is consecutive to the first routing track of the first circuit cell.

The respective first through third routing tracks of the first and second circuit cells are hence provided in the following order, as viewed along a cell height direction: the third, second and first track of the first cell, the first, second and third track of the second cell. Consequently, the layout of the first and second FET device of the second cell may present mirror symmetry with respect to the layout of the first and second FET device of the first cell, wherein the cell boundary between the first and second cell defines the axis of symmetry. By combining two such cells, a number of logic functions may be implemented such as NAND and NOR.

As used herein, the term "gate track" is (similar to the term "routing track") used to denote a geometrical track or plane, along with respective (first/second) gate bodies of the (first/second) FET devices of the first and second cells may be aligned.

In some embodiments, the standard cell semiconductor device may further comprise a first buried power rail arranged along the first routing track of the first circuit cell and the first routing track of the second circuit cell, a second buried power rail arranged along the third routing track of the first circuit cell, and a third buried power rail arranged along the third routing track of the second circuit cell. The first and second circuit cells may hence share a buried power rail. The buried power rails may be embedded (e.g. arranged in respective trenches) in a substrate of the standard cell semiconductor device. The details and benefits of buried power rails discussed in connection with the first aspect apply with appropriate modification to these embodiments of the second aspect.

In some embodiments, the standard cell semiconductor device may further comprise an inter-cell insulating wall arranged on top of and extending along the first buried power rail to separate the common source and drain body portions of the first FET device of the first circuit cell from the common source and drain body portions of the first FET device of the second circuit cell. The first source and drain bodies of the first FET of the first circuit cell may hence be physically and electrically separated from the first source and drain bodies of the first FET of the second circuit cell. The inter-cell insulating wall may further provide fabrication related benefits in that it may provide confinement between the first and second cells during source and drain epitaxy.

BRIEF DESCRIPTION OF THE FIGURES

The above, as well as additional objects, features, and benefits, may be understood through the following illustrative and non-limiting detailed description, with reference to the appended drawings. In the drawings like reference numerals will be used for like elements unless stated otherwise.

All the figures are schematic, not necessarily to scale, and generally only show parts which are necessary to elucidate example embodiments, wherein other parts may be omitted or merely suggested.

DETAILED DESCRIPTION

Figure 1:
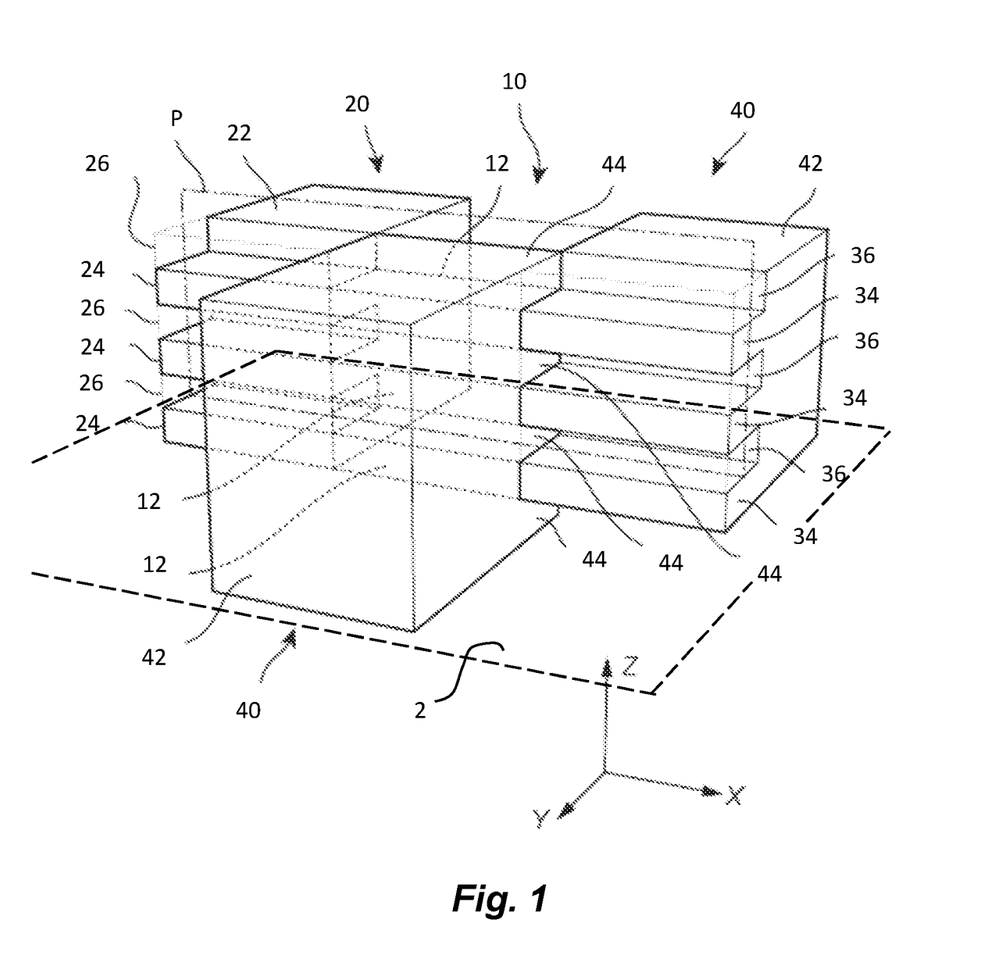
FIG. 1 is a schematic perspective view of a FET device for a circuit cell according to an example embodiment.

FIG. 1 shows a FET device 1 which may be used as a building block in embodiments of a circuit cell, as set out herein.

The FET device 1 comprises a set of channel layers 12, a source body 20, a drain body 30 and a gate body 40.

Reference sign 2 schematically indicates a substrate 2 supporting the FET device 1. The substrate 2 may be a semiconductor substrate, i.e. a substrate comprising at least one semiconductor layer, e.g. of Si, SiGe or Ge. The substrate 2 may be a single-layered semiconductor substrate, for instance formed by a bulk substrate. A multi-layered/composite substrate 2 is however also possible, an epitaxially grown semiconductor layer on a bulk substrate, or a semiconductor-on-insulator (SOI) substrate. As may be appreciated, the substrate 2 may be covered by an insulating layer (e.g. silicon oxide or other conventional inter-layer dielectric material) forming a bottom isolation underneath and surrounding the FET device 1.

In the FIG. 1 and subsequent figures, axis X indicates a first lateral or horizontal direction, Y indicates a second lateral or horizontal direction transverse to X, and Z indicates a vertical direction. The XY-plane is parallel to the main plane of extension of the substrate 2, while the ZX- and ZY-planes are normal thereto.

The source body 20 comprises a common source body portion 22 and a set of vertically spaced apart source prongs 24 protruding from the common source body portion 122 in the Y-direction to define a respective distal free end. The common source body portion 22 and the source prongs 24 together define the source body 20.

The drain body 30 comprises a common drain body portion 32 and a set of vertically spaced apart drain prongs 134. The drain prongs 34 protrude from the common drain body portion 32 in the Y-direction to define a respective distal free end. The common drain body portion 32 and the drain prongs 34 together define the drain body 30.

The set of channel layers 12 comprises a set of vertically spaced apart channel layers or channel layer portions 12. Each channel layer 12 extends in the X-direction between a respective pair of source and drain prongs 24, 34. Accordingly, each pair of source and drain prongs 24, 34 are connected by a respective channel layer 12. More specifically, as indicated in FIG. 1, each channel layer 12 may hence be level with a respective pair of source and drain prongs 24, 34. In the depicted embodiment, the source and drain prongs 24, 34 are coextensive with the channel layers 12 along the Y-direction (i.e. coextensive with the width of the channel layers 12). Additionally, the channel layers 12 are shown to terminate at the source and drain prongs 24, 34 wherein the source and drain prongs 24, 34 are arranged in contact with opposite end surfaces of a respective channel layer 12. It is however envisaged that depending e.g. on the particular process used to form the source and drain prongs 24, 34, the source and drain prongs 24, 34, may protrude into cavities extending only partly through the channel layers 12 along the Y-direction.

The source and drain prongs 24, 34 and the channel layers 12 may each be formed with a nanosheet-shape. A nanosheet may by way of example have a width (along the Y-direction) in a range from 7 nm to 30 nm and a thickness (along the Z-direction) in a range from 2 nm to 10 nm.

The gate body 40 comprises a common gate body portion 42 and a set of vertically spaced apart gate prongs 44. The gate prongs 44 protrude from the common gate body portion 142 in a lateral direction opposite the second lateral direction (the negative Y-direction in the XYZ frame of reference of FIG. 1) to define a respective distal free end. The gate prongs 44 extend to overlap the channel layers 12. The channel layers 12 thus extend in spaces above and/or underneath the gate prongs 44.

Each one of the first source, drain and gate body, with its respective common body portion and laterally extending prongs, may accordingly form a respective fork- or E-shaped body (with a number of legs corresponding to the number of prongs) wherein the fork/E of the gate faces in the opposite direction to the fork/E of the source and drain.

The FET device 10 may as shown further comprise a set of source-side insulating spacer layers 26 arranged between the source prongs 24, and a set of drain-side insulating spacer layers 36 arranged in spaces between the drain prongs 34. Each gate prong 44 may hence be level with and surrounded by a pair of insulating spacer layers 26, 36, as viewed along the channel direction.

The depicted FET device 10 may in other words be defined as comprising an alternating arrangement of first and second device levels, wherein a pair of dielectric layer portions 26, 36 and a gate prong 44 is arranged in each first device level, and a pair of source and drain prongs 24, 34 and a channel layer 12 is arranged in each second device level.

FIG. 1 further indicates a geometrical vertical plane P (parallel to the XZ-plane). The plane P is defined to extend through the set of source prongs 24, the set of channel layers 12 and the set of drain prongs 34. As shown, the common source and drain body portions 22, 32 and the common gate body portion 42 are arranged at mutually opposite sides of the plane P. This design, combined with the vertical offset between the gate prongs 44 and the source and drain layer prongs 24, 34, allows a mutual overlap between the source/drain bodies 20, 30 and the gate body 40 to be minimized. The need for an insulating gate spacer to ensure reliable electrical and capacitive separation between the gate body 40 and each one of the source and drain bodies 20, 30 is hence reduced.

The channel layers 12 may be formed of a semiconductor material, such as a Si-comprising semiconductor material. The channel layers 12 may for example be Si- or SiGe-layers (e.g. nanosheets). These materials are however only examples and it is contemplated that also other semiconductors may be used, such as Ge.

The source and drain prongs 24, 34 may each comprise semiconductor material. The source and drain prongs 24, 34 may be epitaxial semiconductor source and drain prongs 24, 34. The source and drain layer prongs 24, 34 may for example be formed of Si or SiGe, on Si- or SiGe-channel layers 112. The source and drain prongs 24, 34 may be doped with n-type or p-type dopants, in accordance with the conductivity type of the device 1.

The common source body portion 22 and the common drain body portion 32 may each comprise semiconductor material. The common source and drain body portions 22, 32 may be formed as respective epitaxial semiconductor body portions, e.g. of a same material as the source and drain layer prongs 24, 34. The common source and drain body portions 22, 32 for may for example be formed by epitaxially growing source/drain material to form the source and drain layer prongs 24, 34 and continuing the epitaxy such that the source/drain material merges, the merged portions defining a respective semiconductor portion of the common source and drain body portions 22, 32.

The common source and drain body portions 22, 32 may alternatively be formed as metal-comprising body portions, in contact with a merged semiconductor portion, or in contact with non-merged end-portions of the source and drain layer prongs 24, 34, respectively. The metal body-portions may hence form wrap-around contacts for either merged semiconductor portions, or non-merged end-portions of the source and drain layer prongs 24, 34. Example metals include W, Al, Ru, Mo or Co, but more generally any metal conventionally used as source/drain electrode/contact material may be used. The body portions 22, 32 may further comprise a barrier metal layer, e.g. Ta or TaN.

The insulating spacer layers 26, 36 may comprise an oxide or a nitride material. The dielectric layers may be formed of a $SiGeO_x$, $SiO_2$, SiN or (low-k) SiCO.

Figure 2:
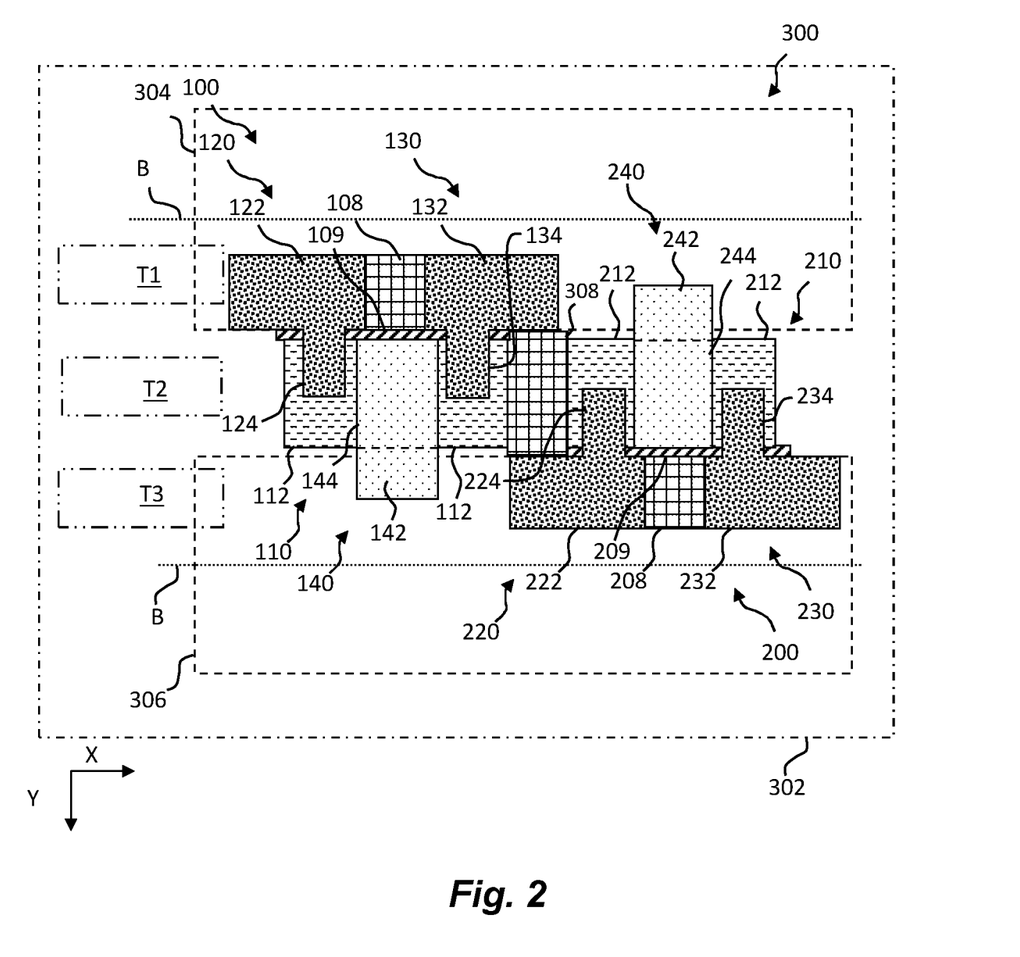
FIG. 2 is a schematic top-down view of a circuit cell according to an example embodiment.

FIG. 2 is a schematic top-down view of a circuit cell 300 comprising a combination of first and second FET devices 100, 200, each with a design corresponding to the FET device 1 shown in FIG. 1. In FIG. 2, reference signs 1xy and 2xy denote corresponding elements xy of the device 1 in FIG. 1. A description of corresponding elements will hence not be repeated.

The X- and Y-axes respectively correspond to a cell length direction and a cell height direction. The dotted lines B represent cell boundaries delimiting the cell in the height direction. Reference sign 302 indicates a substrate.

The FET devices 100, 200 may form a complementary pair of FET devices. For example the first FET device 100 may be a p-type FET and the second FET device 200 an n-type FET, or vice versa.

The cell 300 forms a three-track cell, i.e. a cell with a track height of three routing tracks. T1, T2 and T3 indicate the location of a first, second and third routing track. The routing tracks T1-T3 extend along the X-direction and are spaced apart along the Y-direction. The routing tracks T1-T3 are consecutive to one another and have a uniform spacing and pitch. Routing tracks T1 and T3 may be denoted edge tracks, while track T2 may be denoted a center- or mid-track.

The first common source body portion 122 and the first common drain body portion 132 of the first FET device 100 are each arranged along the first routing track T1. The first set of source prongs 124 and the first set of drain prongs 134 (of which only the top-most is visible in the top-down view) protrude laterally from the first common source and drain body portions 122, 134, respectively, along the Y-direction. The source and drain prongs 124, 134 more specifically protrude from the common source and drain body portions 122, 132 to define an overlap with the second routing track T2, as viewed along the vertical direction (Z). The source and drain prongs 124, 134 hence protrude to a position, or into a space, underneath the second routing track T2. In the illustrated embodiment, the source and drain prongs 124, 134 extend approximately to a center position of the first FET device 100. However in line with the preceding discussion of the source and drain prongs 124, 134 with reference to FIG. 1, the source and drain prongs 124, 134 may present a greater extension such as through/across the full width dimension of the channel layer 112.

The first common gate body portion 142 of the first FET device 100 is arranged along the third routing track T3. The gate prongs 144 (of which only the top-most is visible in the top-down view) protrude laterally from the first common gate body portion 142, along the negative Y-direction. The gate prongs 144 more specifically protrude from the first common gate body portion 142 to define an overlap with the second routing track T2, as viewed along the vertical direction (Z). The gate prongs 144 hence protrude to a position, or into a space, underneath the second routing track T2. As shown, the gate prongs 144 may extend along the full width of the channel layers 112.

The second common source body portion 222 and the second common drain body portion 232 of the second FET device 200 are each arranged along the third routing track T3. The second set of source prongs 224 and the second set of drain prongs 234 (of which only one is visible in the top-down view) protrude laterally from the second common source and drain body portions 222, 234, respectively, along the negative Y-direction. The source and drain prongs 224, 234 more specifically protrude from the common source and drain body portions 222, 232 to define an overlap with the second routing track T2, as viewed along the vertical direction (Z). The source and drain prongs 224, 234 hence protrude to a position, or into a space, underneath the second routing track T2. The above discussion of the extension of the first set of source and drain prongs 124, 134 with respect to the channel layer 112 applies correspondingly to the second set of source and drain prongs 224, 234 and the channel layer 212.

The second common gate body portion 242 of the second FET device 200 is arranged along the first routing track T1. The gate prongs 244 (of which only the top-most is visible in the top-down view) protrude laterally from the second common gate body portion 242, along the Y-direction. The gate prongs 244 more specifically protrude from the second common gate body portion 242 to define an overlap with the second routing track T2, as viewed along the vertical direction (Z). The gate prongs 244 hence protrude to a position, or into a space, underneath the second routing track T2. As shown, the gate prongs 244 may extend along the full width of the channel layers 212.

The first channel layers 112 and the second channel layers 212 each extend along the second routing track T2 between a respective pair of source and drain prongs 124/134 and 224/234. According to conventional standard cell designs based on NSHFETs, the N- and P-type FET are typically provided as parallel devices, along different routing tracks or equivalently different "fin tracks". The channel layers 112 and 212 of the FET devices 100, 200 are in contrast "collapsed" along a same routing track (T2) and a same fin track. The issue with PN separation in conventional low track height cells may thereby be mitigated or avoided. Furthermore, on the one hand the first common source and drain body portions 122/132 and the second common source and drain body portions 222/232, and on the other hand the first common gate body portion 142 and the second common gate body portion 242, are arranged at mutually opposite sides with respect to the second routing track T2. This further allows the first and second FET devices 100, 200 to be arranged at a relatively small separation along the X direction, as may be understood from FIG. 2.

The common source and drain body portions 122, 132 of the first FET device 100 may as shown be separated by a first insulating wall 108. The common source and drain body portions 222, 232 of the second FET device 200 may be separated by a corresponding second insulating wall 208. The insulating walls 108, 208 may be formed by an oxide material such as $SiO_2$, a flowable-CVD oxide, or some other conventional insulating (low-k) material such as SiN, SiNCO or SiCO.

The cell 300 may as shown further comprise a third insulating wall 308, arranged along the second routing track T2 and separating the first set of channel layers 110 from the second set of channel layers 120, as viewed along the second routing track T2. The third insulating wall 308 may further separate the first common drain body portion 132 from the second common source body portion 222. The third insulating wall 308 may facilitate providing the first and second FET devices 100, 200 as devices of complementary conductivity types in that the third insulating wall 308 may facilitate P- and N-type epitaxy confined to the respective FET devices 100, 200. The third insulating wall 308 may for instance be formed of $SiGeO_x$, $SiO_2$, SiN or (low-k) SiCO.

The first FET device 100 may further comprise an insulating spacer 109 arranged along the distal ends of the gate prongs 144, to provide physical and electrical separation between the same and the common source and drain body portions 122, 132. The insulating spacer 109 may be formed as a sidewall spacer layer along the set of channel layers 110 and provided with apertures or openings at positions for receiving the source and drain prongs 124, 134. The spacer 109 may for example be formed of any one of the material examples mentioned in connection with the third insulating wall 308. An insulating spacer 109 may be beneficial in case a gate length or width of the gate prongs 144 (along the X-direction) is such that an overlap is defined between the gate prongs 144 and the common source body portion 122 and/or drain body portion 132. In other words, the insulating spacer 109 may ensure physical and electrical separation is provided between the gate prongs 144 and the common source and drain body portions 122, 132 if the gate length exceeds a separation between the common source and drain body portions 122, 132 (along the X-direction). The second FET device 200 may comprise a corresponding insulating spacer 209.

The cell 300 may as shown further comprise first and second buried power rails (BPRs) 304, 306 arranged along the first and third routing tracks T1, T3, respectively. The BPRs 304, 306 are arranged to define an overlap with and extend in the direction of the first and second routing tracks T1, T3 (e.g. the X-direction). The BPRs 304, 306 may as further shown overlap the respective boundaries B of the cell 300. The BPRs 304, 306 may be formed in respective trenches in the substrate 302, so as to be buried or embedded therein. The BPRs 304, 306 may be formed with a greater width (along the Y-direction) than the routing tracks T1-T3 to enable a reduced IR-drop. One of the first and second power rails may e.g. be configured to provide a VDD supply voltage and the other one a VSS supply voltage. The BPRs 304, 306 may be capped with an insulating layer to allow selective contacting with the source and drain bodies 120, 130, 220, 230. For example, of the source and drain bodies of the first and second FET devices 100, 200, only the first source body 122 may be coupled to the BPR 304 (e.g. VDD) and only the second drain body 234 may be coupled to the BPR 306 (e.g. VSS). However other couplings are also possible, such as the first source body 122 being coupled to the BPR 304 and the second drain body 234 being coupled to a VSS power rail provided in the third routing track T3.

Figure 3:
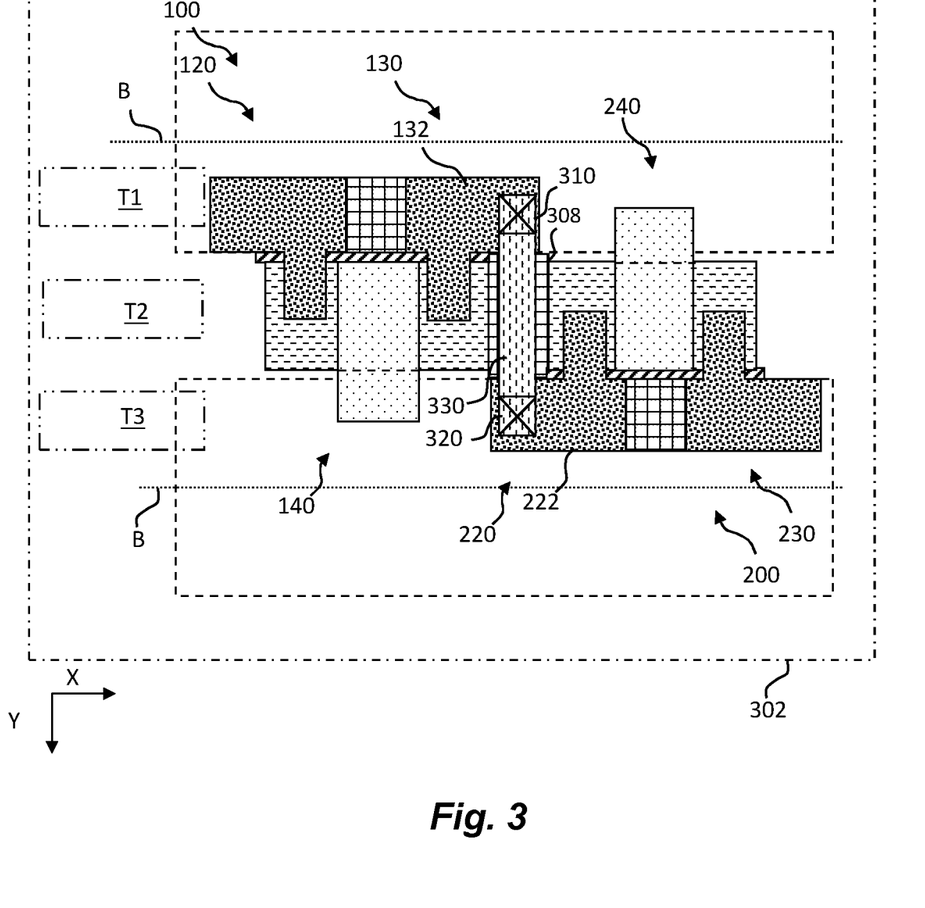
FIG. 3 is a schematic top-down view of a circuit cell according to an example embodiment.

FIG. 3 depicts the cell 300 of FIG. 2, which further has been provided with a source-drain interconnect structure comprising a first via 310 coupled to by abutting the common drain body portion 132 of the first FET device 100, a second via 320 coupled to by abutting the common source body portion 222 of the second FET device, and a conductive line 330 coupled to the first and the second via 310, 320 by abutting the same. The conductive line 330 extends in a direction transverse to the second routing track T2 (along the Y-direction). The source-drain interconnect structure may thus interconnect the drain and source bodies 130, 220 of the FET devices over the third insulating wall 308. A low-resistance source-to-drain connection may hence be provided between the first and second FET devices 100, 200. According to an alternative example of a source-drain interconnect structure, vias may be omitted wherein the common drain and source body portions 132, 222 may be interconnected by only a conductive line abutting the same.

As discussed above, the routing tracks are geometrical track or lanes defining positions or place holders for a routing resource, which may or may not be occupied with a conductive line. Accordingly, and as may be appreciated from FIG. 2, instead of in reference to first, second and third routing tracks, the design of a circuit cell as disclosed herein may also be defined with reference to first, second and third geometrical vertical planes, parallel to each other and equally spaced apart: The common source and drain body portions 122, 132 of the first FET device 100 are arranged along a first geometrical vertical plane (e.g. parallel to the XZ-plane). The common gate body portion 142 is arranged along a third geometrical vertical plane parallel to the first plane. Each channel layer 112 of the set of channel layers 110 of the first FET device 100 extend along a second geometrical vertical plane parallel to and intermediate the first and third planes. The sets of source and drain prongs 124, 134 protrude from the common source and drain body portions 122, 132 (e.g. in the Y-direction) to define an overlap with or intersect the second plane. The set of gate prongs 144 protrude from the common gate body portion 142 (e.g. in the negative Y-direction) to define an overlap with or intersect the second plane. The common source and drain body portions 222, 232 of the second FET device 200 are arranged along the third geometrical vertical plane. The common gate body portion 242 is arranged along the first geometrical vertical plane. Each channel layer 212 of the set of channel layers 210 of the second FET device 200 extend along the second geometrical vertical plane parallel. The sets of source and drain prongs 224, 234 protrude from the common source and drain body portions 222, 232 (e.g. in the negative Y-direction) to define an overlap with or intersect the second plane. The set of gate prongs 244 protrude from the common gate body portion 242 (e.g. in the Y-direction) to define an overlap with or intersect the second plane.

A fabrication process for a circuit cell according to the present disclosure, such as the circuit cell 300, may comprise forming a number of FET devices 1 with a design as shown in FIG. 1. A fabrication process for such FET devices 1 may be based on processing of a multi-layered stack of nanosheets, e.g. patterned in the shape of an elongated fin structure on a substrate. The stack may as an example comprise an alternating stack of Si and SiGe layers, wherein either the Si- or the SiGe-layers are to form the channel layers. The semiconductor material of the non-channel layers may be replaced by an insulating material, such as $SiGeO_x$, $SiO_2$, SiN or (low-k) SiCO, SiC, SiCN, SiOCN, SiBCN or SiBCNO. Non-channel layers of $SiGeO_x$, $SiO_2$ may for example be formed by selectively oxidizing the SiGe- or Si-layers. Alternatively, the replacement may comprise removing the Si- or SiGe-layers using a selective etch to form longitudinal cavities in the fin at the positions of the removed layers, and then filling the thusly formed cavities in the fin with the insulating material. According to a further example, a fin structure comprising insulating non-channel layers and semiconductor channel layers may be formed directly by patterning fin structures a multi-layered SOI structure (e.g. Si/$SiO_2$/Si/$SiO_2$/Si/ . . . ). The fin may in either case subsequently be embedded in an oxide (e.g. an STI-oxide of a different material than the insulating material of the non-channel layers). Prior to being embedded in oxide, a liner may be conformally deposited over the fin (e.g. a SiN-layer deposited by atomic layer deposition). Source and drain bodies may subsequently be formed by opening a "source trench" and a "drain trench" in the embedding oxide selectively at the side of the fin structure where the common source and drain body portions are desired. The channel layers may then be etched isotropically from the source and drain trenches to form source and drain cavities in the channel layers. If a liner is present, also the liner may first be opened from the source and drain trenches. Source and drain bodies comprising source prongs (in the source and drain cavities) and common source and drain body portions (in the source and drain trenches) may then be formed by epitaxially growing source/drain material from surface portions of the channel layers exposed in the source and drain cavities. A gate body may thereafter be formed in a corresponding fashion, by forming a gate trench on the opposite side of the fin structure, isotropically etching the non-channel layers from the gate trench to form gate cavities in the non-channel layers, and subsequently depositing a gate stack (e.g. gate dielectric, one or more WFMs, and gate electrode material) in the gate cavities and the gate trench. If fin structure has been provided with the aforementioned liner, the liner remaining on the side of the fin structure opposite with respect to the gate cavity, may form an insulating spacer layer corresponding to the insulating spacer 109.

It is envisaged that a number of such FET devices may be formed along each one of a plurality of parallel fin structures. Insulating walls corresponding to the above mentioned third insulating wall may be formed along each fin structure, prior to the source/drain epitaxy, e.g. by forming a cut in each fin and filling the cut with an insulating wall material.

Figure 4:
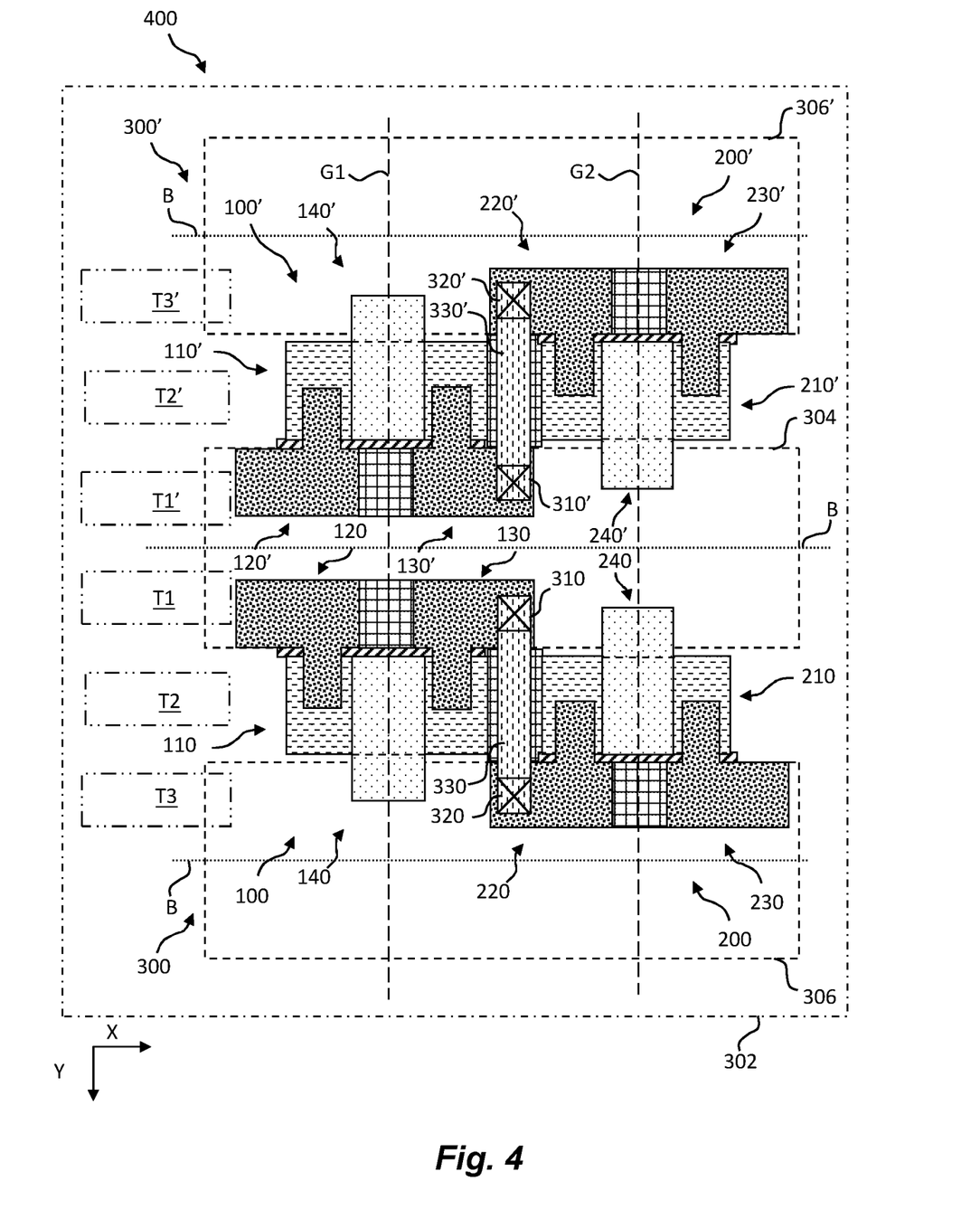
FIG. 4 is a schematic top-down view of first and second circuit cells of a standard cell semiconductor device according to an example embodiment.

FIG. 4 is a top-down view of first and second neighboring circuit cells 300, 300' of a standard cell semiconductor device or integrated circuit 400. The cells 300, 300' each correspond to the cell 300 of FIG. 3 but wherein the layout of the cell 300' is mirrored with respect to the cell 300 with the boundary B as the axis of symmetry. Like reference signs are used for elements of the first and second cells 300, 300' but an apostrophe or prime is added to refer to an element of the second cell 300'. Hence, any preceding discussion concerning an element with reference sign xyz of cell 300 applies correspondingly to an element with reference sign xyz' of the cell 300'.

As described above, T1-T3 denotes routing tracks of the first cell 300, or more specifically routing tracks of the standard cell semiconductor device 400 which overlap/extend along the first cell 300. Correspondingly, T1'-T3' denotes routing tracks of the second cell 300', or more specifically routing tracks of the standard cell semiconductor device 400 which overlap/extend along the second cell 300'. The routing tracks T1'-T3' (like the tracks T1-T3) extend along the X-direction and are spaced apart along the Y-direction. The routing tracks T1'-T3' are consecutive to one another and have a uniform spacing and pitch. Routing tracks T1' and T3' may be denoted edge tracks, while routing track T2' may be denoted a center- or mid-track. The routing tracks T1'-T3' are consecutive to the routing tracks T1-T3 however (due to the mirror symmetry) the order of the routing tracks in a bottom-up direction of FIG. 4 (i.e. negative Y-direction) is T3, T2, T1, T1', T2', T3'.

The gate body 140 of the first FET device 100 of the first cell 300 and the gate body 140' of the first FET device 100' of the second cell 300' are arranged along a first common geometric gate track G1 transverse to (anyone of) the routing tracks T1-T3'. etc. Correspondingly, the gate body 240 of the second FET device 200 of the first cell 300 and the gate body 240' of the second FET device 200' of the second cell 300' are arranged along a second common geometric gate track G2 parallel to the first gate track G1, or in other words transverse to (anyone of) the routing tracks T1-T3'.

The device 400 may as shown further comprise first, second and third BPRs 304, 306, 306'. The BPRs 304 and 306 are as discussed in reference to FIG. 2 arranged along the routing tracks T1 and T3. However as shown in FIG. 4, the BPR 304 further extends along the cell boundary B and has a width dimension (along the Y-direction) such that the BPR 304 defines an overlap with each one of the first routing tracks T1 and T1'. The BPR 304 is hence shared between or common to the cells 300 and 300'. Meanwhile, the third BPR 306' is arranged along the third routing track T3'. Hence, the BPRs 304 and 306' are arranged to define an overlap with and extend in the direction of the routing tracks T1' and T3' (e.g. the X-direction).

Although not shown as a separate feature, to not overly obscure the figure, the device 400 may further comprise a vertically oriented inter-cell insulating wall arranged on top of and extending along the BPR 306 at a position corresponding the cell boundary B between the cells 300, 300'. The inter-cell insulating wall may separate the common source and drain body portions 120, 130 of the first FET device 100 from the common source and drain body portions 120', 130' of the first FET device 100'. The inter-cell insulating wall may for instance be formed of $SiGeO_x$, $SiO_2$, SiN or (low-k) SiCO.

The FET devices 100, 200, 100', 200' of the cells 300, 300' may be interconnected using an interconnect structure comprising conductive lines (horizontally oriented, parallel to the XY-plane) and conductive vias (vertically oriented, normal to the XY-plane) to implement various circuit functions. The interconnect structure may comprise conductive lines and vias for inter-cell routing as well as conductive lines and vias for intra-cell routing. The interconnect structure may for instance comprise conductive lines provided in one or more of the routing tracks T1-T3'. As an example, a conductive line in routing track T1 may be coupled to the common source drain body 120 by a via landing on a top surface of the body 120. As a further example, a conductive line in routing track T2 may be coupled to the gate body 140 and/or 240 by a (respective) via landing on a top surface of the body 140/240 (e.g. a top gate prong thereof). As a further example, a conductive line 330 and/or 330' extending transverse to the routing tracks T1-T3' may be coupled to the source and drain bodies 130, 220 and/or 130', 230' by respective pairs of vias 310, 320 or 310', 320'.

While routing tracks T1-T3' may refer to routing tracks of a metal-1 (M1) level (and conductive lines therein thus referring to conductive lines of the M1 level), conductive lines for signal routing between the cells 300 and 300' may either be provided in higher metal levels (e.g. M2 or M3) and/or in a level below the M1 level, sometimes referred to as the middle-end-of line (MOL) or MOB level, (MOA referring to the "contact level", i.e. the level of the source, drain and gate bodies).

Two examples of logic gates which may be implemented using the cells 300, 300' will now be described with reference to FIGS. 5-6. In these examples, the figures include crossed squares to indicate vias connecting the respective conductive lines to the respective lower lying structures. In the examples, the first FET devices 100, 100' are p-type FETs and the second FET devices 200, 200' are n-type FETs.

Figure 5:
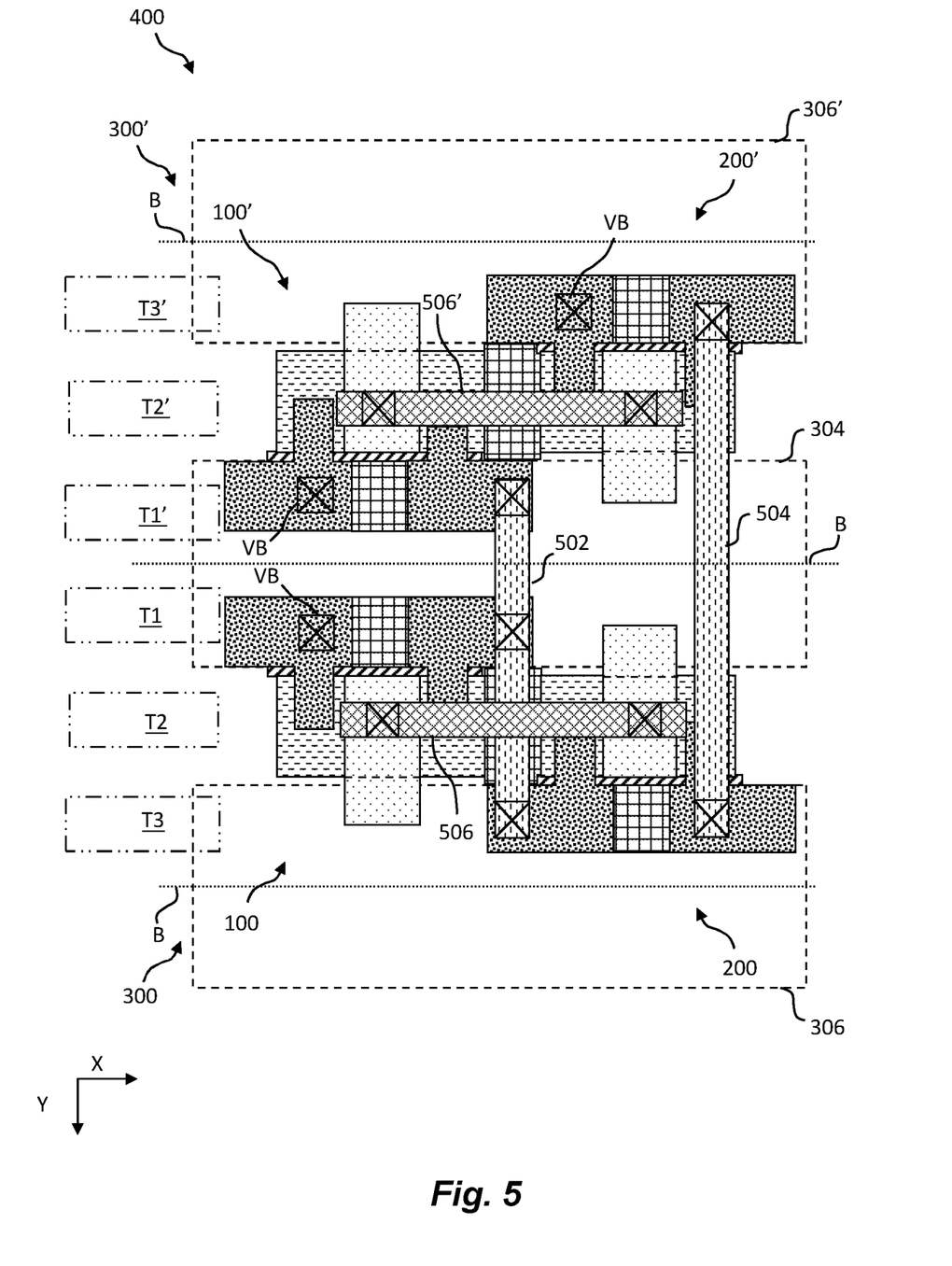
FIG. 5 is a schematic top-down view of first and second circuit cells configured as a NAND-gate, according to an example embodiment.

FIG. 5 shows an example wherein the cells 300, 300' of FIG. 4 are configured to implement a NAND-gate, e.g. a 2-input NAND. A conductive line 502 interconnects the source body of the second FET device 200 with the drain body of the first FET device 100 and the drain body of the first FET device 100'. A conductive line 504 interconnects the drain body of the second FET device 200 with the drain body of the second FET device 200'. The conductive lines 506 and 506' interconnect the gate bodies of the first and second FET device 100, 200 and the gate bodies of the first and second FET device 100', 200', respectively. The conductive line 506 may as shown for example extend over and across the conductive line 502, but an opposite arrangement with line 502 extending over and across line 506 is also possible. The vias VB indicate possible locations of vias for connecting the cells 300, 300' to BPRs, e.g. BPR 304 and 306'.

Figure 6:
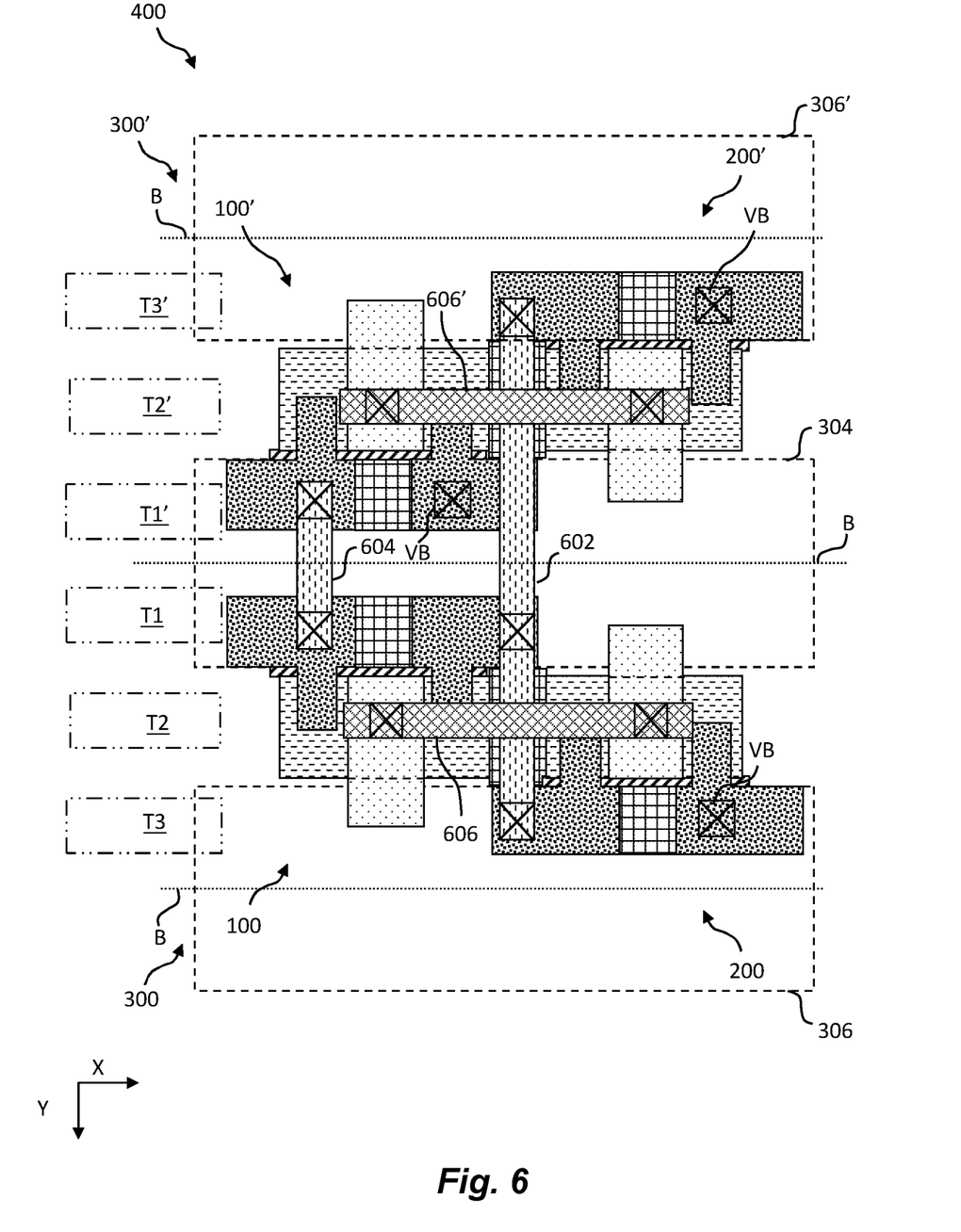
FIG. 6 is a schematic top-down view of first and second circuit cells configured as a NAND-gate, according to an example embodiment.

FIG. 6 shows an example wherein the cells 300, 300' of FIG. 4 are configured to implement a NOR-gate, e.g. a 2-input NOR. A conductive line 602 interconnects the source body of the second FET device 200 with the drain body of the first FET device 100 and the source body of the second FET device 200'. A conductive line 604 interconnects the source body of the first FET device 100 with the source body of the first FET device 100'. The conductive lines 606 and 606' interconnect the gate bodies of the first and second FET device 100, 200 and the gate bodies of the first and second FET device 100', 200', respectively. The vias VB indicate possible locations of vias for connecting the cells 300, 300' to BPRs, e.g. BPR 304, 306 and 306'.

In the above the various embodiments herein have mainly been described with reference to a limited number of examples. However, as is readily appreciated by a person skilled in the art, other examples than the ones disclosed above are equally possible within the scope of the present disclosure, for example those defined by the appended claims.

What is claimed is:

1. A circuit cell for a standard cell semiconductor device, comprising:
    a first field-effect transistor (FET) device comprising:
        a source body and a drain body, each comprising a common source or drain body portion arranged along a first routing track of the circuit cell, and a set of source or drain prongs protruding from the common source or drain body portion to define an overlap with a second routing track of the circuit cell that is parallel to the first routing track,
        a set of channel layers, each channel layer extending along the second routing track between a pair of the source and drain prongs, and
        a gate body comprising a common gate body portion arranged along a third routing track of the circuit cell that is parallel to the second routing track, the second routing track being intermediate between the first and third routing tracks, and the gate body further comprising a set of gate prongs protruding from the common gate body portion to define an overlap with the second routing track and the channel layers; and
    a second FET device comprising:
        a source body and a drain body, each comprising a common source or drain body portion arranged along the third routing track, and a set of source or drain prongs protruding from the common source or drain body portion to define an overlap with the second routing track,
        a set of channel layers, each channel layer extending along the second routing track between a pair of the source and drain prongs, and
        a gate body comprising a common gate body portion arranged along the first routing track, and a set of gate prongs protruding from the common gate body portion to define an overlap with the second routing track and the channel layers.

2. The circuit cell of claim 1, further comprising a first insulating wall separating the common source and drain body portions of the first FET device, and a second insulating wall separating the common source and drain body portions of the second FET device.

3. The circuit cell of claim 1, further comprising a third insulating wall arranged along the second routing track and separating the set of channel layers of the first FET device from the set of channel layers of the second FET device.

4. The circuit cell of claim 1, wherein the first and second FET devices each further comprise: respective sets of source-side insulating spacer layers arranged between the source prongs of respective FET devices and a set of drain-side insulating spacer layers arranged in spaces between the drain prongs of respective FET devices, wherein each gate prong of respective FET device is arranged intermediate between a respective pair of source-side and drain-side insulating spacer layers.

5. The circuit cell according of claim 1, wherein each pair of source and drain prongs is arranged in level with a respective channel layer.

6. The circuit cell of claim 1, wherein the circuit cell is a three-track height cell, the second routing track being a center track and the first and third routing tracks being edge tracks.

7. The circuit cell of claim 1, wherein the circuit cell comprises a first buried power rail arranged along the first routing track, and a second buried power rail arranged along the third routing track.

8. The circuit cell of claim 1, further comprising a source-drain interconnect structure comprising a conductive line coupled to the common drain body portion of the first FET device and the common source body portion of the second FET device.

9. The circuit cell of claim 1, wherein the channel layers are formed of Si-comprising layers.

10. A FET device comprising:
    a source body and a drain body, each comprising a common source or drain body portion arranged along a first routing track of the FET device, and a set of source or drain prongs protruding from the common source or drain body portion to define an overlap with a second routing track of the FET device that is parallel to the first routing track,
    a set of channel layers, each channel layer extending along the second routing track between a pair of source and drain prongs, and
    a gate body comprising a common gate body portion arranged along a third routing track of the FET device that is parallel to the second routing track, the second routing track being intermediate between the first and third routing tracks, and the gate body further comprising a set of gate prongs protruding from the common gate body portion to define an overlap with the second routing track and the channel layers,
    wherein the source and drain prongs comprise semiconductor material and the common source and drain body portions comprise semiconductor material and/or metal.

11. A standard cell semiconductor device comprising first and second neighboring circuit cells, wherein the first circuit cell comprises:
    a first field-effect transistor (FET) device comprising:
        a source body and a drain body, each comprising a common source or drain body portion arranged along a first routing track of the first circuit cell, and a set of source or drain prongs protruding from the common source or drain body portion to define an overlap with a second routing track of the first circuit cell that is parallel to the first routing track, a set of channel layers, each channel layer extending along the second routing track between a pair of the source and drain prongs, and a gate body comprising a common gate body portion arranged along a third routing track of the first circuit cell that is parallel to the second routing track, the second routing track being intermediate between the first and third routing tracks, and the gate body further comprising a set of gate prongs protruding from the common gate body portion to define an overlap with the second routing track and the channel layers; and a second FET device comprising:

a source body and a drain body, each comprising a common source or drain body portion arranged along the third routing track, and a set of source or drain prongs protruding from the common source or drain body portion to define an overlap with the second routing track, a set of channel layers, each channel layer extending along the second routing track between a pair of the source and drain prongs, and a gate body comprising a common gate body portion arranged along the first routing track, and a set of gate prongs protruding from the common gate body portion to define an overlap with the second routing track and the channel layers;

wherein the second circuit cell comprises:

a third FET device comprising:

a source body and a drain body, each comprising a common source or drain body portion arranged along a first routing track of the second circuit cell, and a set of source or drain prongs protruding from the common source or drain body portion to define an overlap with a second routing track of the second circuit cell that is parallel to the first routing track of the second circuit cell, a set of channel layers, each channel layer extending along the second routing track of the second circuit cell between a pair of the source and drain prongs, and a gate body comprising a common gate body portion arranged along a third routing track of the second circuit cell that is parallel to the second routing track of the second circuit cell, the second routing track of the second circuit cell being intermediate between the first and third routing tracks of the second circuit cell, and the gate body further comprising a set of gate prongs protruding from the common gate body portion to define an overlap with the second routing track of the second circuit cell and the channel layers; and a fourth FET device comprising:

a source body and a drain body, each comprising a common source or drain body portion arranged along the third routing track of the second circuit cell, and a set of source or drain prongs protruding from the common source or drain body portion to define an overlap with the second routing track of the second circuit cell, a set of channel layers, each channel layer extending along the second routing track of the second circuit cell between a pair of the source and drain prongs, and a gate body comprising a common gate body portion arranged along the first routing track of the second circuit cell, and a set of gate prongs protruding from the common gate body portion to define an overlap with the second routing track of the second circuit cell and the channel layers;

wherein the gate body of the first FET device and the gate body of the third FET device are arranged along a first gate track transverse to the routing tracks, wherein the gate body of the second FET device and the gate body of the fourth FET device are arranged along a second gate track that is parallel to the first gate track, and wherein the first routing track of the second circuit cell is consecutive to the first routing track of the first circuit cell.

12. The standard cell semiconductor device of claim 11, further comprising a first buried power rail arranged along the first routing track of the first circuit cell and the first routing track of the second circuit cell, a second buried power rail arranged along the third routing track of the first circuit cell, and a third buried power rail arranged along the third routing track of the second circuit cell.

13. The standard cell semiconductor device of claim 12, further comprising an inter-cell insulating wall arranged on top of and extending along the first buried power rail to separate the common source and drain body portions of the first FET device from the common source and drain body portions of the third FET device.

14. The standard cell semiconductor device of claim 12, further comprising a first insulating wall separating the common source and drain body portions of the first FET device, and a second insulating wall separating the common source and drain body portions of the second FET device.

15. The standard cell semiconductor device of claim 12, further comprising a third insulating wall arranged along the second routing track of the first circuit cell and separating the set of channel layers of the first FET device from the set of channel layers of the second FET device.

16. The standard cell semiconductor device of claim 12, wherein the first and second FET devices each further comprise: respective sets of source-side insulating spacer layers arranged between the source prongs of respective FET devices and a set of drain-side insulating spacer layers arranged in spaces between the drain prongs of respective FET devices, wherein each gate prong of respective FET device is arranged intermediate between a respective pair of source-side and drain-side insulating spacer layers.

17. The standard cell semiconductor device according of claim 12, wherein each pair of source and drain prongs is arranged in level with a respective channel layer.

18. The standard cell semiconductor device of claim 12, wherein the first circuit cell is a three-track height cell, the second routing track of the first circuit cell being a center track and the first and third routing tracks of the first circuit cell being edge tracks.

19. The standard cell semiconductor device of claim 12, wherein the first circuit cell comprises a first buried power rail arranged along the first routing track of the first circuit cell, and a second buried power rail arranged along the third routing track of the first circuit cell.

20. The standard cell semiconductor device of claim 12, further comprising a source-drain interconnect structure comprising a conductive line coupled to the common drain body portion of the first FET device and the common source body portion of the second FET device.

* * * * *